United States Patent [19]

Duncan et al.

[11] Patent Number: 4,585,931
[45] Date of Patent: Apr. 29, 1986

[54] METHOD FOR AUTOMATICALLY IDENTIFYING SEMICONDUCTOR WAFERS

[75] Inventors: Hibbert A. Duncan, East Windsor, N.J.; Francis J. Ehret, North Whitehall Township, Lehigh County, Pa.; Sherwin R. Kahn, South Brunswick Township, Middlesex County, N.J.; Karen H. Kinney, Lawrence Township, Mercer County, N.J.; Peter D. Parry, Montgomery Township, Somerset County, N.J.

[73] Assignee: AT&T Technologies, Inc., Berkeley Heights, N.J.

[21] Appl. No.: 553,655

[22] Filed: Nov. 21, 1983

[51] Int. Cl.$^4$ ............................................. G06K 7/10
[52] U.S. Cl. ................................... 235/464; 235/463; 369/109
[58] Field of Search ..................... 235/462, 463, 464; 369/97, 109

[56] References Cited

U.S. PATENT DOCUMENTS

| | | |
|---|---|---|
| 3,558,899 | 1/1971 | Morgan et al. . |
| 3,562,536 | 2/1971 | Brunner et al. . |
| 3,597,045 | 8/1971 | Mathisen . |
| 3,720,924 | 3/1973 | Aagard ............................ 369/109 X |
| 3,876,842 | 4/1975 | Bouwhuis ............................ 369/109 |
| 4,010,355 | 3/1977 | Roehrman et al. . |
| 4,020,357 | 4/1977 | Punis . |
| 4,082,943 | 4/1978 | Jensen et al. ..................... 235/463 X |
| 4,147,295 | 4/1979 | Nojiri et al. . |
| 4,166,574 | 9/1979 | Yokoyama ....................... 235/464 X |
| 4,239,151 | 12/1980 | Enser et al. . |
| 4,348,803 | 9/1982 | Sasaki . |

OTHER PUBLICATIONS

"Code 39 ®-Alphanumeric Bar Code Specifications", published Jan., 1982, by Intermec Corporation.
"Bar Code Symbology, Some Observations on Theory and Practice"; David C. Allais; *Intermec;* Feb. 16, 1982; p. 4.
"Coding and Decoding of Wafers"; B. I. C. F. Van Pul; *Solid State Technology;* Jun. 1979, pp. 77-79.

*Primary Examiner*—David L. Trafton
*Attorney, Agent, or Firm*—M. M. de Picciotto; R. B. Levy

[57] ABSTRACT

A technique for automatically identifying a semiconductor wafer (30) having bar code identification indicia (32) on the front surface (31) thereof. Reading of the code is achieved by rotating the wafer about an axis (34) perpendicular to its front surface (31); directing a beam of radiant energy (37) at the code (32) along a predetermined direction relative to the front surface (31); and sensing, while rotating the wafer, the reflected radiant energy (39) within a second predetermined angular direction relative to the front surface. The bar code used herein is preferably a modified or "stretched" bar code 39 formed on the front surface of the wafer, and having an aspect ratio (i.e., dimension of a space/dimension of a bar) ranging from 1 to 4 (FIG. 2).

19 Claims, 3 Drawing Figures

METHOD FOR AUTOMATICALLY IDENTIFYING SEMICONDUCTOR WAFERS

TECHNICAL FIELD

The present invention relates to a method for identifying semiconductor wafers and more particularly, to a method for automatically identifying a semiconductor wafer having coded indicia inscribed on the surface thereof.

BACKGROUND OF THE INVENTION

In the semiconductor industry, disc-shaped semiconductor wafers form the basic medium for manufacturing electronic integrated circuits and devices. Typically, each wafer is subjected to a series of processing steps necessary to form tens of thousands of microelectronic devices. Thus, it becomes apparent that such wafers acquire considerable value at each processing step is performed. Since these wafers are fragile, and their features are delicate, the processing steps usually take place in a clean room environment to avoid particulate contamination of the wafers. The transport of the wafers in and out of such clean room, and between processing stations within the clean room, is typically achieved by using wafer carriers or cassettes capable of accommodating about 25 wafers, with each wafer held in a separate pocket of the cassette in a substantially upright position.

In an effort to minimize damage and particulate contamination of the wafers and thereby achieve high manufacturing yields, operator handling of the wafers is being substantially avoided by resorting to automation. In an automated semiconductor wafer processing facility, it becomes essential to first identify each individual wafer of a cassette to verify that the correct wafers are in such cassette. Also, the identification of each wafer is required to insure that the appropriate processing steps associated with a particular wafer are indeed carried out on such wafer.

Various forms of wafer identifications have been used in the manufacturing of semiconductor integrated circuits. For example, conventional letters and numerals have been placed on the surface of a wafer so that a technician could look at the wafer and determine its type and category without requiring a detailed wafer pattern analysis. Clearly, such a known technique does not avoid operator handling of the wafers. Moreover, such a technique substantially reduces the throughput of the integrated circuits production line.

Several attempts have been made at automatic identification of semiconductor wafers. One technique which has been suggested is the etching of the back surface of a wafer to form a code. Light is directed at the back surface of the wafer and the radiation reflected therefrom is detected to provide an electrical indication of the code inscribed in the wafer. The handling of such a wafer to read its back surface may damage the integrated circuits formed on its front surface. Another known identification technique makes use of an etched binary or frequency code in the kerf areas of the front surface of the wafer, i.e., in those unused portions of the front surface between each semiconductor chip of an array of chips formed in the wafer.

Although the foregoing approaches appear to avoid operator handling of the wafers, the accuracy and reliability of such prior art techniques have not proven to be acceptable. In other words, there still exists a need for a reliable, inexpensive and accurate technique for marking an identifying semiconductor wafers.

SUMMARY OF THE INVENTION

The foregoing need is met in accordance with an embodiment of the invention wherein a method for automatically identifying a semiconductor wafer comprises the steps of providing coded indicia including bars and spaces in a predetermined portion of a surface of the semiconductor wafer; rotating the semiconductor wafer about an axis perpendicular to the surface thereof; directing, while rotating the wafer, a beam of radiant energy at the predetermined portion of the wafer surface along a first predetermined angular direction relative thereto; and sensing at a radiant energy sensing means, while rotating the wafer, the radiant energy reflected by the space portions of the coded indicia within a second predetermined angular direction relative to the surface of the wafer to generate signals identifying the wafer.

In a preferred embodiment of the invention, the method comprises laser marking bar code indicia in a predetermined portion of the front surface of the wafer, the bar code having an aspect ratio of spaces and bars ranging from 1 to 4; continuously rotating the semiconductor wafer about an axis perpendicular to its front surface; positioning optical means at a predetermined distance from the front surface; directing an optical beam, along a first predetermined angular direction relative to the front surface, out of said optical means toward the bar code indicia; and sensing at the optical means, while rotating the wafer, the optical energy reflected by the spaces of the bar code indicia within a second predetermined angular direction thereby generating signals identifying the wafer.

DETAILED DESCRIPTION

Conventional bar code identifications used in labellng, warehousing, merchandising, etc., comprise a combination of narrow bars, narrow spaces, wide bars and wide spaces. Such conventional applications typically exhibit code densities, i.e., numbers of characters per inch, ranging from 3 to about 10. Also, these bar codes are normally used on highly reflective materials with good contrast (e.g., paper) with white background and non-reflective black lines representing the spaces and the bars, respectively. A known widely used bar code, often referred to as bar code "39" or "3-of-9", makes use of nine elements per character, wherein each element is either a space or a bar, each element being either a narrow one or a wide one. Bar code "39" is designed such that each character consists of one wide space, two wide bars, three narrow spaces and three narrow bars. A characteristic of such a known code is that the width of a narrow bar is equal to that of a narrow space, and the width of a wide bar is equal to that of a wide space. In other words, the aspect ratio of such a conventional code, defined as the quotient of the width of a space and that of a bar is equal to 1.

Figure 1:
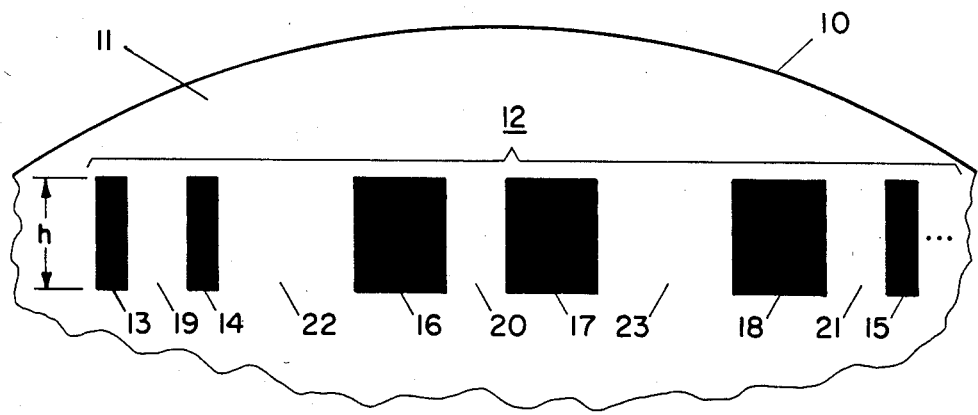
FIG. 1 shows a portion of a semiconductor wafer with coded indicia in accordance with an embodiment of the present invention.

Shown in FIG. 1 is an enlarged view of a portion of a semiconductor wafer 10 having on one surface 11 thereof a high density bar code identification 12 in accordance with an embodiment of the invention. For purpose of illustration, only a small section of the bar code 12 is shown in the drawing in order to assist in the description and understanding of that embodiment of the present invention. As shown, the bar code identification 12 comprises a combination of narrow bars 13, 14 and 15; wide bars 16, 17 and 18; narrow spaces 19, 20 and 21; and wide spaces 22 and 23.

In accordance with an embodiment of the invention, the narrow aspect ratio of the bar code 12, defined as the ratio between the width of a narrow space (e.g., spaces 19, 20, 21) and that of a narrow bar (e.g., bars 13, 14, 15) is selected within a range of 1.0 and 4.0. Preferably, a narrow space-to-narrow bar aspect ratio of the order of 2.0 has proven to be advantageous. Similarly, the wide aspect ratio of the bar code 12, i.e., the ratio between the width of a wide space (e.g., spaces 22, 23) and that of a wide bar (e.g., bars 16, 17, 18), is also selected within a range of 1.0 and 4.0. Preferably, a wide space-to-wide bar aspect ratio of the order of 1.5 has proven to be advantageous. The code density of such a high density bar code 12 is of the order of 23 characters per inch.

In a preferred embodiment of the invention, the above-described bar code identification 12 is formed on the front surface of the wafer 10 using a laser marking technique which minimizes the production of marking debris thus reducing the source of particle contamination. A preferred laser marking technique, in accordance with an embodiment of the invention, makes use of a commercially available laser having a power of the order of 2.2 Watts, operating at a Q-switched repetition rate of about 9 kHz, and a scan speed of the order of 100 mm/sec. Such high repetition rate and high scan speed cause the laser marking beam to remain at a point on the wafer surface for a substantially reduced time period compared to other known laser marking techniques. The foregoing results in a smaller quantity of wafer material being removed (i.e., less marking debris), in lower wafer surface temperatures (i.e., less oxy-nitride film formed on the surface), and in substantially reduced depths of the marks thus formed (of the order of 8 to 10 μm).

An exemplary wafer bar code identification, marked on the front surface of a silicon wafer using the foregoing laser marking technique and parameters, was successfully formed on a small rectangular portion of the surface of the wafer, the portion having dimensions of about 100 mils. The height dimension, h, of the bars was approximately 100 mils, and the widths of the bars and those of the resulting spaces were as follows:

Narrow Bar: 1.8 to 2.2 mils
Narrow Space: 3.6 to 4.3 mils
Wide Bar: 6.4 to 6.8 mils
Wide Space: 9.1 to 9.8 mils In order to read the bar code 12 shown in FIG. 1, it is necessary to form an image of the code on a detector from which an electrical signal can be derived. Reading a bar code formed on the surface of a semiconductor wafer is not as straightforward as reading a bar code from printed labels. First, the size of the bar code shown in FIG. 1 (approximately 100 mils in bar height) is between 3 and 4 times smaller than the smallest commercially available printed labels which typically have character densities of about 9.4 characters per inch, bar heights of 340 mils, wide bar widths of 16.8 mils and narrow bar widths of 7.5 mils. Second, the apparent contrast of the wafer bar code is poor since it is gray-on-gray in comparison to black-on-white as is the case for printed labels.

Figure 2:
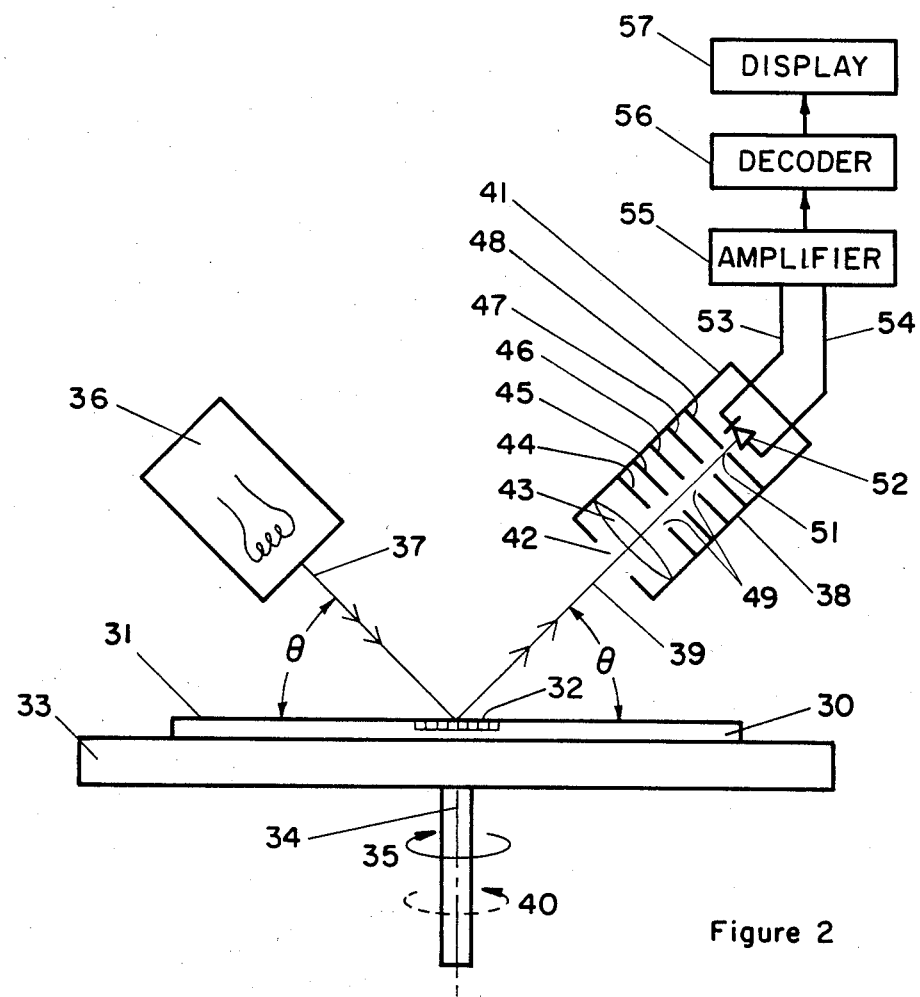
FIG. 2 schematically shows an apparatus for practicing the wafer identification technique in accordance with an embodiment of the invention.

Shown in FIG. 2 is an arrangement and technique for automatically identifying a semiconductor wafer 30 having on the front surface 31 thereof a bar code identification 32 of a type similar to the bar code identification 12 described in FIG. 1. The arrangement comprises a base or platform 33 capable of being rotated about an axis 34 as schematically illustrated by directional arrows 35 or 40. The wafer 30 is placed and held on the base 33 with its front surface 31 exposed. A source of radiant energy 36 (such as a light source), positioned proximate to the base 33, is capable of generating a radiant energy beam 37 directed at the bar coded portion of the surface 31 of the wafer 30 at a predetermined angle $\theta$ therewith. An optical sensing device 38, positioned proximate to the base 33, is adapted to receive radiant energy reflected by the space portions of the bar code 32 and by the front surface 31 of the wafer 30. The reflected radiant energy is schematically illustrated by a single beam 39 shown at the same angle $\theta$ with respect to the surface 31 of the wafer 30. The angle $\theta$ may be selected from a range of about 30° to about 60°, preferably $\theta$ is of the order of 45°.

The optical sensing device 38 comprises an elongated housing 41 having at one end thereof an opening 42 for allowing the reflected radiant energy beam 39 to enter the sensing device 38. The housing 41 includes an optical system capable of converging radiant energy. Such an optical system may include, for example, a convergent lens 43 positioned proximate to the opening 42, and a plurality of successive optical baffles 44 to 48 positioned behind the lens 43. Each baffle 44 to 48 has a centrally located aperture (e.g., 49) for allowing the reflected radiant energy beam 39 to propagate through the housing 41 away from the lens 43. As shown, the dimensions of the successive apertures decrease as the distance between their corresponding baffles and the lens 43 increases. The last optical baffle 48 of the plurality of successive baffles within the sensing device 38 has a small aperture 51 located in front of a photodetector 52, e.g., a photodiode. The aperture 51 is positioned within the housing 41 such that it is in line with the apertures of the baffles 44 to 47 and substantially in the plane where the lens 43 focuses an image of the bar code 32. All light which passes through the aperture 51 is then incident on the photodetector 52. As the image of the bar code 32 moves past the aperture 51, the radiant energy incident on the photodetector 52 increases and decreases in proportion to the amount of radiant energy respectively reflected and diffused by the spaces and the bars of the bar code 32.

The reflected radiant energy beam 39 reaching the photodetector 52 causes electrical analog signals to be generated on the output leads 53 and 54 of the optical sensing device 38. The analog signals on leads 53 and 54 are coupled to an amplifier 55. Coupled to the amplifier 55 is decoding circuit 56 of a generally available type, such as Model 9300 manufactured and sold by Interface Mechanisms, Inc., of Lynwood, Wash. The decoding circuit 56 may be coupled to a display device or panel 57 capable of displaying the identification number and code of the wafer 30. High resolution of the above-described reading arrangement is achieved by adequately selecting the parameters of the lens 43 and the respective sizes of the apertures 49 and aperture 51. In a preferred embodiment of the invention, the lens 43 is a convex lens having a focal length of the order of 12.5 mm, the apertures 49 range from about 3 mm down to about 1 mm, and the aperture 51 is a pinhole of about 100 microns in diameter.

Figure 3:
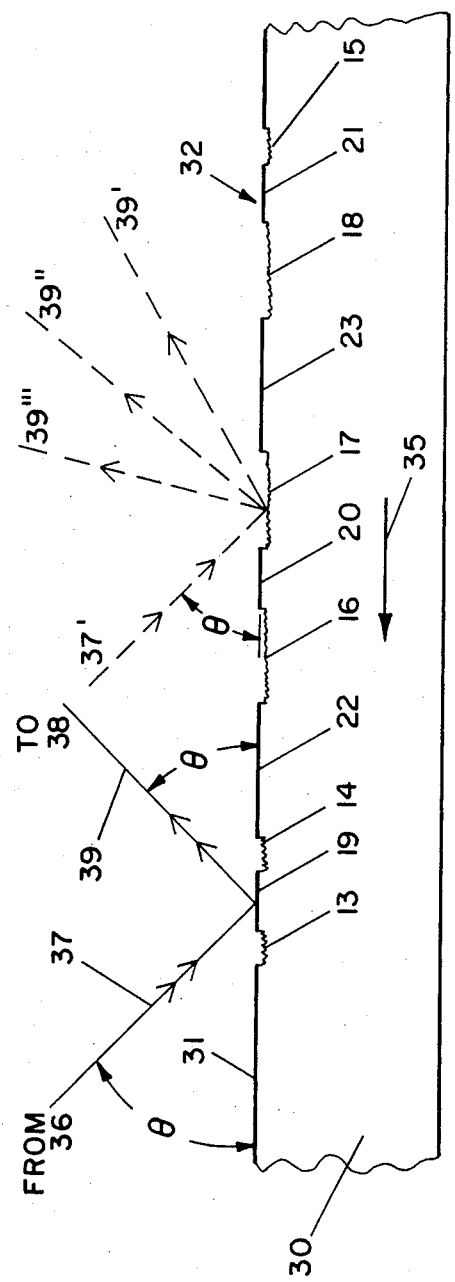
FIG. 3 is an enlarged view of a portion of the coded indicia shown in FIG. 2.

In order to better appreciate the teachings of the present invention, a small portion of the bar code 32 of FIG. 2 is shown in FIG. 3 at a substantially enlarged scale. The bars and spaces of the bar code 32 in FIG. 3 have identical reference numerals to the bars and spaces described in FIG. 1. During a reading operation, high contrast is achieved by using the fact that the front surface 31 of the wafer 30 and the wide and narrow spaces 19, 20, 21, 22 and 23 of the coded portion 32 are reflective. The laser marked regions of the coded portion 32, i.e., the narrow and wide bars 13, 14, 15, 16, 17 and 18 have a certain surface roughness.

As the wafer 30 rotates and the coded portion 32 of the wafer 30 passes within the field of view of the sensing device 38, the reflective space portions of the bar code will reflect the beam 37 and direct the reflected beam 39 toward the sensing device 38. As the wafer 30 rotates further, a rough laser marked bar (such as, for example, wide bar 17) will pass within the field of view of sensing device 38 at a later point in time, as schematically illustrated by beam 37'. The roughness of the surface of the bar 17 causes the radiant energy of beam 37' to scatter into a plurality of lower intensity beams such as 39', 39" and 39'" within a solid angle which is much larger than the acceptance angle of the sensing device 38. The intensity of the incident beam 37 is selected such that the scattered lower intensity beams 39', 39", and 39'" are of substantially lower magnitudes compared to the intensity of the reflected beam 39. The output signals corresponding to the laser marked bars, generated by the photodetector 52 and the amplifier circuit 55, are of substantially lower amplitude than those corresponding to the spaces. Also, the intensity of the reflected beam 39 causes the amplifier circuit 55 to operate in saturation. Thus, in accordance with an embodiment of the invention, the foregoing technique achieves high contrast reading signals between bars and spaces although the apparent contrast of the wafer bar code is gray-on-gray.

It is well within the spirit and scope of the invention to either continuously rotate the wafer 30 in one direction as illustrated by directional arrow 35, or continuously rotate the wafer 30 in the opposite direction as illustrated by directional arrow 40. Alternatively, during a reading operation, the coded portion 32 of the wafer 30 may be first passed in front of the beam 37 in the direction 35, then the base 33 is stopped, and rotated back in the direction 40. In other words, the wafer 30 would be alternately rotated in two opposite rotational directions 35 and 40 thus scanning the code with the beam 37 in two opposite circumferential directions.

In accordance with a further embodiment of the invention, the sensing device 38 of FIG. 2 may be displaced in a radial direction of the wafer 30, i.e., in a direction perpendicular to the plane of the drawing of FIG. 2 along the height dimension of the bars. Such displacement of the sensing device 38, enables the scanning of the bar code 32 at various heights of the bars. In other words, if the reading and decoding of the bar code cannot be achieved while the code moves past the sensing device 38, by displacing the latter along the height, h (see FIG. 1), of the bars, a second scanning of the code at a different level thereof can be accomplished. Such a displacement may be achieved in stepwise manner between the height boundaries of the bars. Alternatively, the displacement of the sensing device 38 in the radial direction of the wafer may be a continuous one at a speed less than the rotational speed of the wafer 30. Also, such displacement can be achieved in two opposite radial directions. Depending upon the rotational direction of the wafer, scanning of the code can be achieved from "left-to-right" or from "right-to-left" at different bar height levels.

Furthermore, the radiant energy source 36 and the sensing device 38 may be displaced simultaneously in a radial direction of the wafer in order to scan the bar code 32 at various heights thereof. Similarly, such a displacement of the source 36 and the sensing device 38 may be achieved in a stepwise manner or a continuous one between the height boundaries of the bars along one radial direction or along two opposite radial directions. In this way, the sensing device 38 can sense the radiant energy reflected from the space portions of the code at successively different radial positions along the length thereof.

As shown in FIG. 2, the beam source 36 and the sensing device 38 are positioned with respect to each other such that the beams 37 and 39 are in a plane substantially perpendicular to the direction of the height, h, of the bars. However, without departing from the spirit and scope of the invention, the positioning of the source 36 and the sensing device 38 may be rotated such that the beams 37 and 39 are in a plane other than that perpendicular to the height of the bars. Also, the beam source 36 and the sensing device 38 may be positioned side-by-side. Such a further embodiment would require the addition of some beam deflecting and collecting arrangement (e.g., mirrors) for directing the beam 37 towards the surface 31 of the wafer 30 and for collecting the reflected beam 39 back into the sensing device 38.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A method for automatically identifying a semiconductor wafer comprising the steps of:

providing coded indicia including bars and spaces of a selected length in a predetermined portion of a surface of a semiconductor wafer;

imparting a relative rotational motion between the semiconductor wafer and a radiant energy sensing means through at least a predetermined arc about an axis perpendicular to the surface of the wafer while imparting a relative linear motion therebetween in a radial direction along the surface of the wafer;

directing a beam of radiant energy at said predetermined portion of the surface of the wafer along a first predetermined angular direction relative thereto so that the beam of radiant energy is reflected from the space portions of the coded indicia into the radiant energy sensing means along a second angular direction relative to the surface of the wafer;

sensing, at the radiant energy sensing means, the radiant energy reflected by the space portions of the coded indicia at successively different positions along the length thereof as the relative linear motion is imparted between the wafer and the radiant energy sensing means while the relative rotational motion is imparted therebetween, to generate signals identifying the wafer.

2. A method according to claim 1, wherein the providing step comprises the step of laser marking the front surface of the wafer with a bar code comprising a combination of wide and narrow bars separated by narrow and wide spaces.

3. A method according to claim 2, wherein the laser marking step comprises forming a bar code with a space-to-bar aspect ratio ranging from 1.5 to 4.0.

4. A method according to claim 3, wherein the laser marking step comprises forming a narrow bar smaller than a narrow space, and forming a wide bar smaller than a wide space.

5. A method according to claim 4, wherein the narrow space-to-narrow bar aspect ratio is of the order of 2.0, and wherein the wide space-to-wide bar aspect ratio is of the order of 1.5.

6. A method according to claim 1, wherein the imparting of a relative linear motion between the radiant energy sensing means and the wafer is accomplished by continuously moving the radiant energy sensing means radially along the surface of the wafer.

7. A method according to claim 6, comprising continuously moving the radiant energy sensing means along two opposite radial directions of the wafer between the boundaries of said coded indicia.

8. A method according to claim 1, wherein the rotating step comprises the step of continuously rotating the semiconductor wafer.

9. A method according to claim 1, wherein the rotating step comprises the step of alternately rotating the semiconductor wafer in two opposite rotational directions thereby scanning the coded indicia with the beam in two opposite directions.

10. A method for automatically identifying a semiconductor wafer having coded indicia on a surface thereof, the method comprising the steps of:

laser marking bar code indicia in a predetermined portion of the front surface of the wafer, said bar code including wide spaces and wide bars and narrow spaces and narrow bars of a predetermined length and width with the ratio of the width of the narrow spaces to the narrow bars ranging from 2.0 to 4.0 and the ratio of the width of the wide spaces to the wide bars ranging from 1.5 to 4.0;

continuously rotating the semiconductor wafer about an axis perpendicular to its front surface;

moving an optical means in a radial direction along the front surface of the wafer;

directing an optical beam, along a first predetermined angular direction relative to the rotating front surface of the wafer toward the bar code indicia thereon; and sensing, at the optical means during the movement thereof in a radial direction along the front surface of the wafer as it rotates, the optical energy reflected by the spaces of the bar code indicia at successively different positions along the length thereof, within a second predetermined angular direction, thereby generating signals identifying the wafer.

11. A method according to claim 10, wherein the step of moving said optical means comprises the step of:

continuously displacing the optical means successively along two opposite radial directions on the surface of the wafer between the boundaries of the bar code indicia.

12. A bar code identification for semiconductor wafers comprising a plurality of wide bars, wide spaces, narrow bars and narrow spaces wherein the ratio of the width of the narrow spaces to the narrow bars ranges from 2.0 to 4.0 and wherein the ratio of the width of the wide spaces to the wide bars ranges from 1.5 to 4.0 .

13. A bar code according to claim 12, wherein the ratio of the width of the narrow spaces to the narrow bars is on the order of 2.0.

14. A bar code according to claim 12, wherein the ratio of the width of the wide spaces to the wide bars is on the order of 1.5.

15. A bar code according to claim 12, wherein the width of a narrow bar is of the order of 2 mils.

16. A bar code according to claim 12, wherein the width of a narrow space is of the order of 4 mils.

17. A bar code according to claim 12, wherein the width of a wide bar is of the order of 7 mils.

18. A bar code according to claim 12, wherein the width of a wide space is of the order of 10 mils.

19. A bar code according to claim 12, wherein the bars are laser marked bars having depths of the order of 10 $\mu$m.

* * * * *